(12) United States Patent
Huang et al.

(10) Patent No.: US 7,852,079 B2
(45) Date of Patent: Dec. 14, 2010

(54) APPARATUS FOR LOW AC LOSS THERMAL SHIELDING AND METHOD OF MAKING SAME

(75) Inventors: Xianrui Huang, Clifton Park, NY (US); Evangelos T. Laskaris, Schenectady, NY (US); Paul S. Thompson, Stephentown, NY (US); Bulent Aksel, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 1168 days.

(21) Appl. No.: 11/461,544

(22) Filed: Aug. 1, 2006

(65) Prior Publication Data

US 2010/0237868 A1 Sep. 23, 2010

(51) Int. Cl.
*G01V 3/00* (2006.01)
*H01F 7/00* (2006.01)
*H01F 1/00* (2006.01)

(52) U.S. Cl. ............... 324/318; 324/322; 335/301; 335/216

(58) Field of Classification Search ......... 324/318–322; 505/878, 879, 825; 220/560.14, 560.13, 220/560.12, 901, 902; 335/216, 296–306
See application file for complete search history.

(56) References Cited

U.S. PATENT DOCUMENTS

| 5,225,782 | A | 7/1993 | Laskaris et al. |
| 5,446,433 | A | 8/1995 | Laskaris et al. |
| 6,783,059 | B2 | 8/2004 | Laskaris et al. |
| 7,187,169 | B2 * | 3/2007 | Clarke et al. ............. 324/307 |
| 7,319,329 | B2 * | 1/2008 | Huang et al. ............. 324/319 |
| 7,626,477 | B2 * | 12/2009 | Huang et al. ............. 335/216 |
| 2006/0091881 | A1 * | 5/2006 | Clarke et al. ............. 324/301 |
| 2007/0120564 | A1 * | 5/2007 | Huang et al. ............. 324/318 |
| 2007/0120630 | A1 * | 5/2007 | Huang et al. ............. 335/216 |
| 2009/0146658 | A1 * | 6/2009 | McDowell et al. .......... 324/309 |

FOREIGN PATENT DOCUMENTS

| EP | 0228683 A2 | 7/1987 |
| JP | 5082333 A | 2/1993 |
| JP | 5172924 A | 7/1993 |

OTHER PUBLICATIONS

European Patent Office Search Report, dated Nov. 26, 2007, 7 pages.
European Patent Office, Office Action, dated Sep. 18, 2008, 5 pages.
European Patent Office, Office Action Response, dated Mar. 26, 2009, 5 pages.
European Patent Office, Grant Communication 71(3), dated Nov. 3, 2009, 28 pages.

* cited by examiner

*Primary Examiner*—Brij B. Shrivastav
*Assistant Examiner*—Tiffany A Fetzner
(74) *Attorney, Agent, or Firm*—Scott J. Asmus (57) ABSTRACT

A apparatus for low AC loss thermal shielding includes a plurality of thermally conducting fibers positioned along a desired direction of heat conduction. The fibers are electrically insulated from each other. The fibers are bonded together with a matrix, and a thermal link connects the bonded fibers to a cryogenic cold head.

11 Claims, 9 Drawing Sheets

APPARATUS FOR LOW AC LOSS THERMAL SHIELDING AND METHOD OF MAKING SAME

BACKGROUND OF THE INVENTION

The invention relates generally to superconducting magnet systems and more particularly to low AC loss thermal shields of a superconducting magnet system.

In one example, an MR system includes a cold mass that comprises a superconducting magnet, a magnet coil support structure, and a helium vessel. Liquid helium contained in the helium vessel provides cooling for the superconducting magnet and maintains the superconducting magnet at a low temperature for superconducting operations, as will be understood by those skilled in the art. The liquid helium maintains the superconducting magnet approximately and/or substantially at the liquid helium temperature of 4.2 Kelvin (K). For thermal isolation, the helium vessel that contains the liquid helium in one example comprises one or more thermal shields and a vacuum vessel.

The vacuum vessel maintains a vacuum environment that eliminates convection heat loads. The thermal shield intercepts radiation and conduction heat loads to the cold mass. Conventional thermal shields are made of conductive metals such as copper or aluminum. The thermal shield is cooled to an intermediate temperature between 4.2 K and the room temperature by a cryocooler or some cryogen such as the liquid nitrogen. It completely surrounds the 4.2 K cold mass to block radiation heat from the room temperature vacuum vessel to the cold mass. Good thermal conduction is required for the thermal shield to make its temperature as low as possible. When the magnet is operated in an AC field, such as during MR imaging, eddy currents will be induced in the thermal shield components. The eddy current generates heat in the thermal shield that must be removed by the cryogenic system. Also, during a magnet quench, as the current of the magnet coil rapidly decays to zero, large eddy currents and quench forces will be induced in the thermal shield. It is difficult for the thermal shield to withstand the quench forces. It is also difficult to structurally support the thermal shield under the quench forces.

It would therefore be desirable to have an apparatus configured to reduce quench forces and eddy currents generated by AC fields in the thermal shield.

BRIEF DESCRIPTION OF THE INVENTION

The present invention provides an apparatus for reducing AC losses that overcomes the aforementioned drawbacks. A plurality of thermally conducting fibers are positioned along a desired direction of heat conduction. Each fiber is electrically insulated from another fiber. The fibers are bonded together with a matrix, and a thermal link connects the bonded fibers to a cryogenic cold head.

In accordance with one aspect of the invention, an apparatus includes a cryogenic cold head and a plurality of thermally conducting fibers positioned along a desired direction of heat conduction, each fiber electrically insulated from another fiber. A matrix bonding the plurality of thermally conducting fibers together is included. The apparatus also includes at least one thermal link connecting the plurality of thermally conducting fibers to the cryogenic cold head.

In accordance with another aspect of the invention, a method of manufacturing a thermal shield includes positioning at least one thermally conducting fiber on a tooling form along a desired path of heat conduction, the at least on thermally conducting fiber coated with electrical insulation. The method further includes fixing the at least one thermally conducting fiber with a matrix and thermally connecting the at least one thermally conducting fiber to a cryogenic cold head.

In accordance with yet another aspect of the invention, an MRI apparatus includes a magnetic resonance imaging system having a plurality of gradient coils positioned about a bore of a superconducting magnet to impress a polarizing magnetic field and an RF transceiver system and an RF switch controlled by a pulse module to transmit RF signals to an RF coil assembly to acquire MR images. The MRI apparatus also includes a cryogenic cold head and a thermal link thermally connected to the cryogenic cold head. The apparatus further includes a thermal shield positioned adjacent to the superconducting magnet, the thermal shield comprising a set of electrically insulated wires thermally attached to the thermal link and configured to conduct heat to the thermal shield. A matrix is included affixing the set of electrically insulated wires together.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
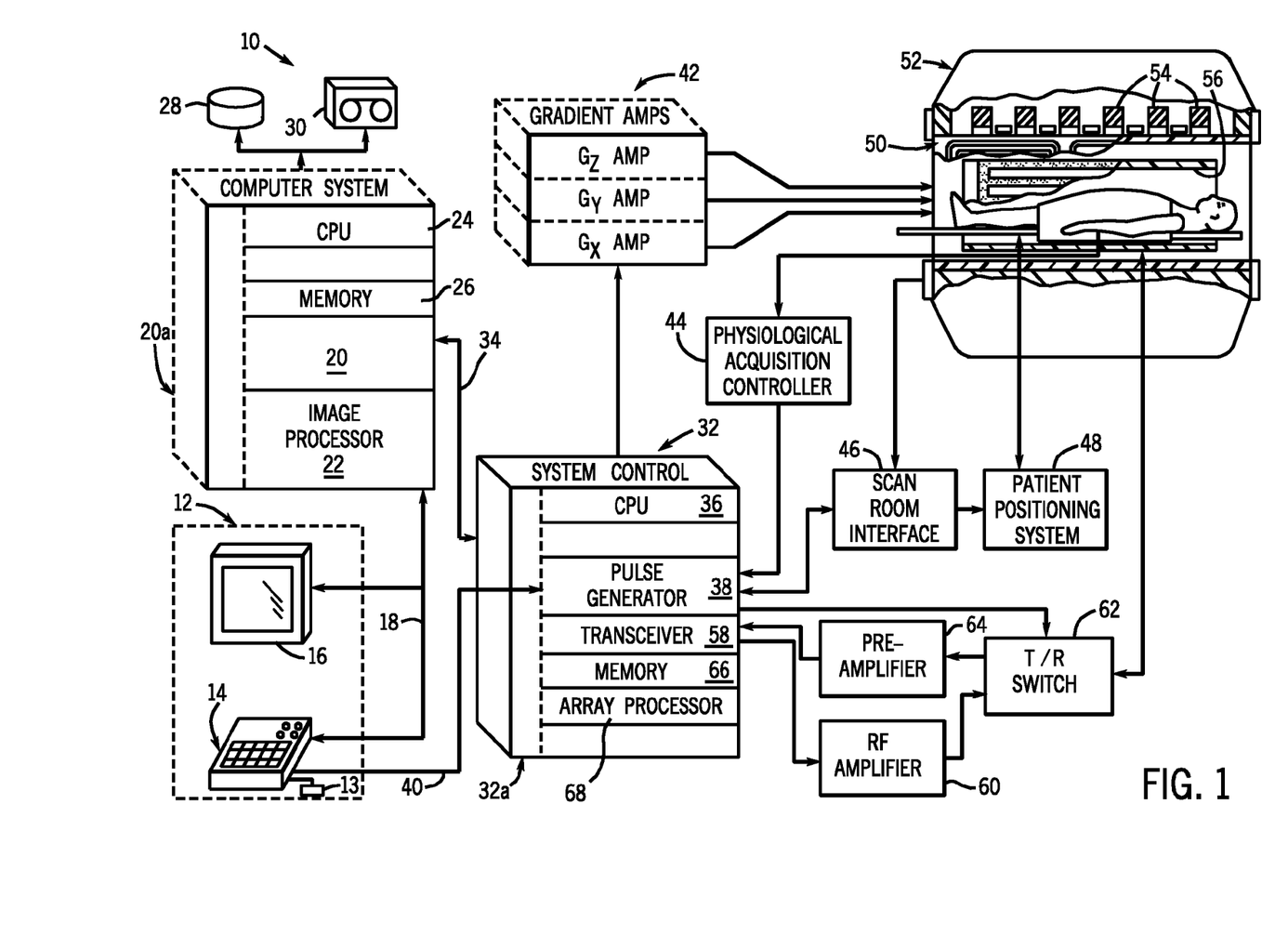
FIG. 1 is a schematic block diagram of an MR imaging system that can benefit from incorporation of an embodiment of the present invention.

Referring to FIG. 1, the major components of a preferred magnetic resonance imaging (MRI) system 10 benefiting from incorporating an embodiment of the present invention are shown. The operation of the system 10 is controlled from an operator console 12, which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$, amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figures 2, 3, 4:
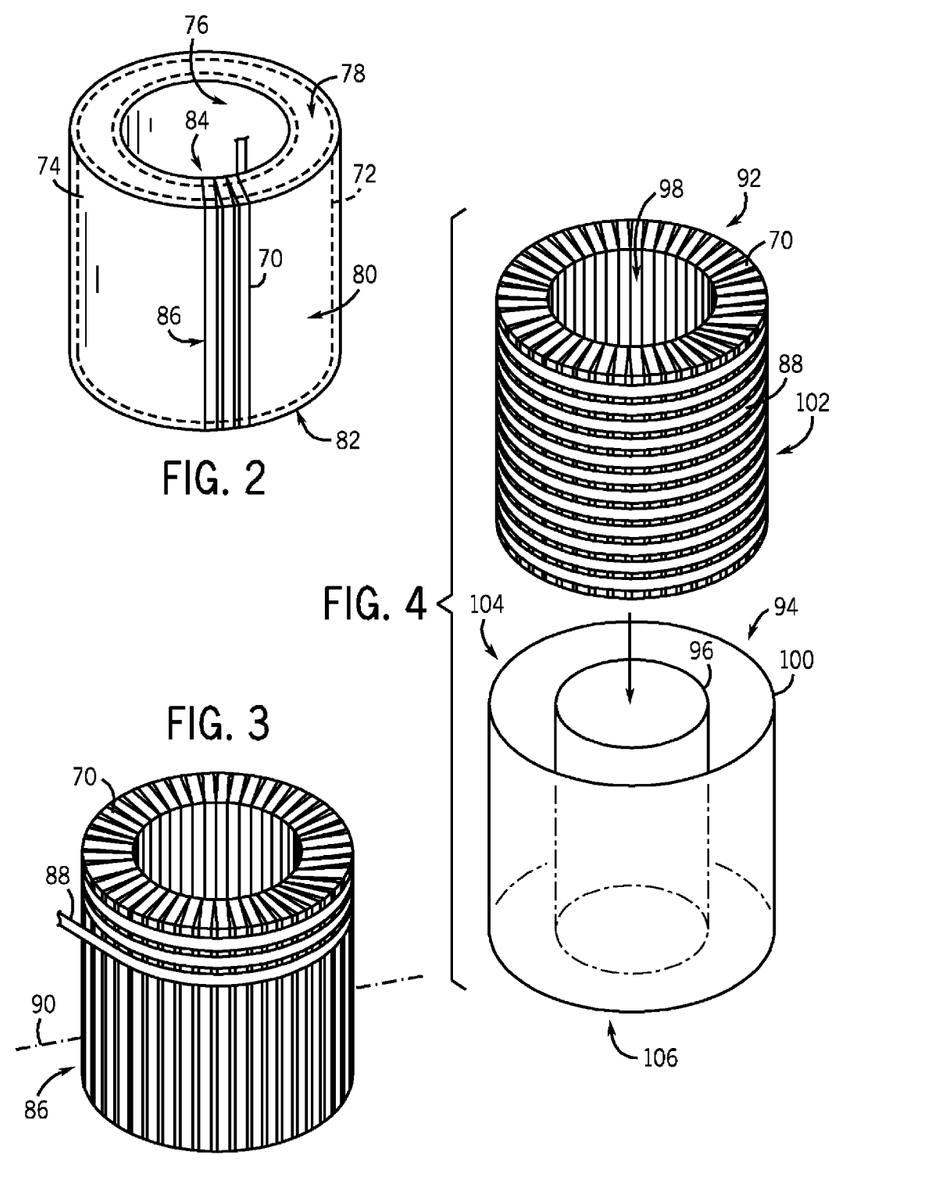
FIGS. 2-6 show steps of making a shell of thermal shield in accordance with an embodiment of the present invention.

FIGS. 2-6 show steps of making a shell of a thermal shield in accordance with an embodiment of the present invention. FIG. 2 shows a thermally conductive wire or cable 70 toroidally wrapped about an annular tool 72. In a preferred embodiment, the annular tool 72 is lined with a fiberglass cloth 74 to circumferentially reinforce the thermal shield. The toroidal wrapping includes wrapping cable 70 about the annular tool 72: (a) axially along an inner surface 76, (b) radially along a first end surface 78 toward an outer surface 80, (c) axially along the outer surface 80, (d) radially along a second end surface 82 toward the inner surface 76, and repeating (a) through (d) circumferentially around the annular tooling 72. Cable 70 is positioned about the annular tooling 72 such that heat conduction thermally conducts heat from an inner section 84 of toroidally wrapped cable 70 toward an outer section 86 thereof.

FIG. 3 shows a thermally conductive wire or cable 88 spirally wrapped over the toroidally wrapped cable 70. Preferably, cables 70, 88 are separate cables; however, it is contemplated that cables 70, 88 are the same cable. Cable 88 is circumferentially and spirally wrapped about the outer diameter 86 of toroidally wrapped cable 70. Cable 88 is spirally wrapped such that heat conduction thermally conducts heat toward the axial center 90 of the thermal shield.

After cables 70, 88 are wrapped as described above, the wrapped annular tool 92 is placed inside a vacuum bag 94 as shown in FIG. 4. In a preferred embodiment, vacuum bag 94 is annular shaped to enclose the wrapped annular tool 92. Vacuum bag 94 includes an inner tube wall 96 inserted into a bore 98 of wrapped annular tooling 92 and an outer tube wall 100 placed over an outer surface 102 of wrapped annular tooling 92. Tube walls 96 and 100 are fused together at each end 104, 106 to create a vacuum-tight bag.

Figures 5, 6:
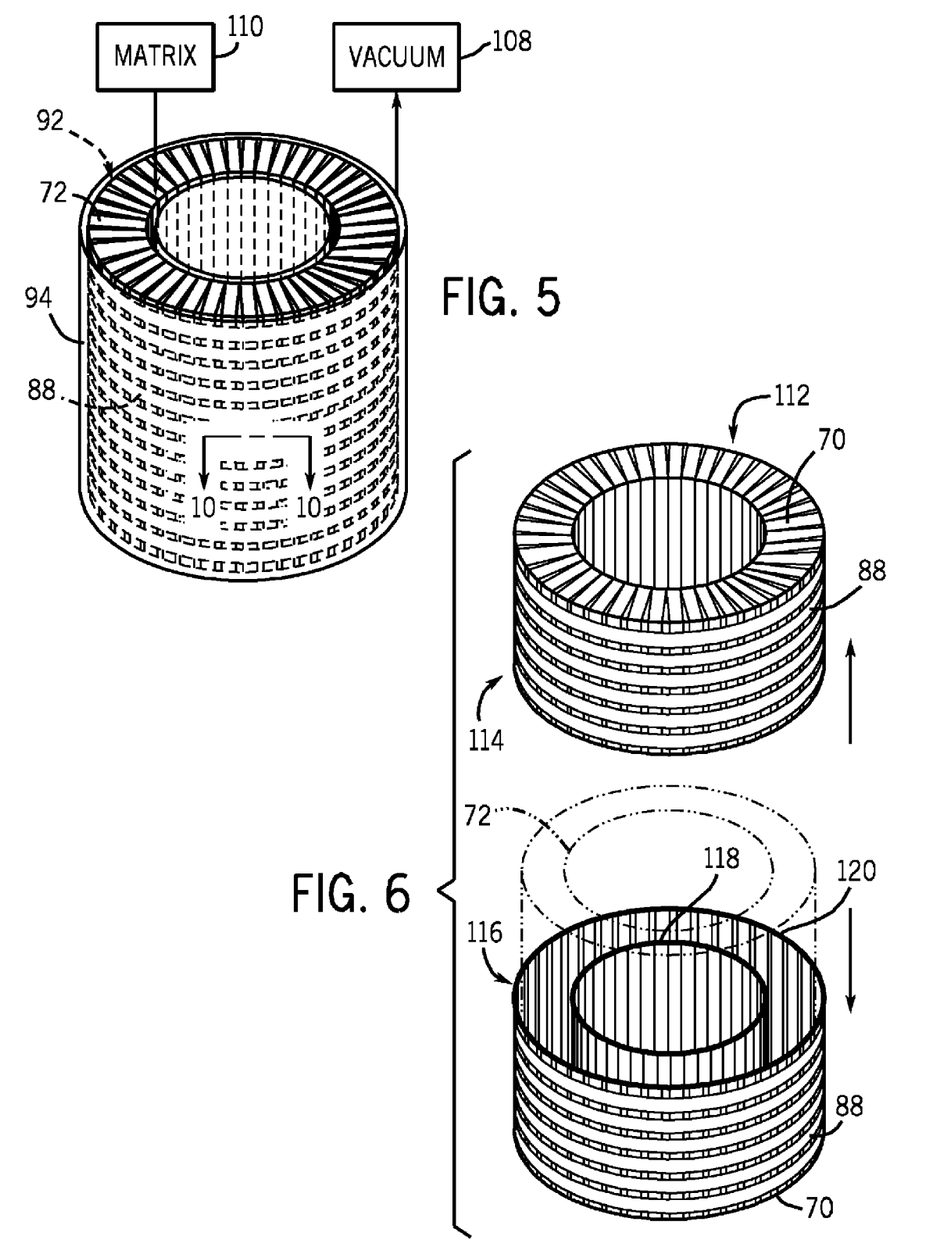

As shown in FIG. 5, a vacuum 108 is created inside vacuum bag 94. The vacuum 108 causes vacuum bag 94 to contract. In this manner, cables 70 and 88 are pressed against the annular tool 72 to take the shape thereof. Once a vacuum 108 has been created inside vacuum bag 94, a matrix 110 is infused so as to permeate voids inside vacuum bag 94. In a preferred embodiment, matrix 110 is an epoxy. The matrix 110 is allowed to cure, and once cured, vacuum bag 94 is removed therefrom.

Referring to FIG. 6, a shell 112 formed by cables 70 and 88, fiberglass cloth 74, and matrix 110 is separated into at least two sections 114, 116 and removed from the annular tooling 72 by cutting through the shell along an inner circumference 118 and an outer circumference 120 thereof.

Figure 7:
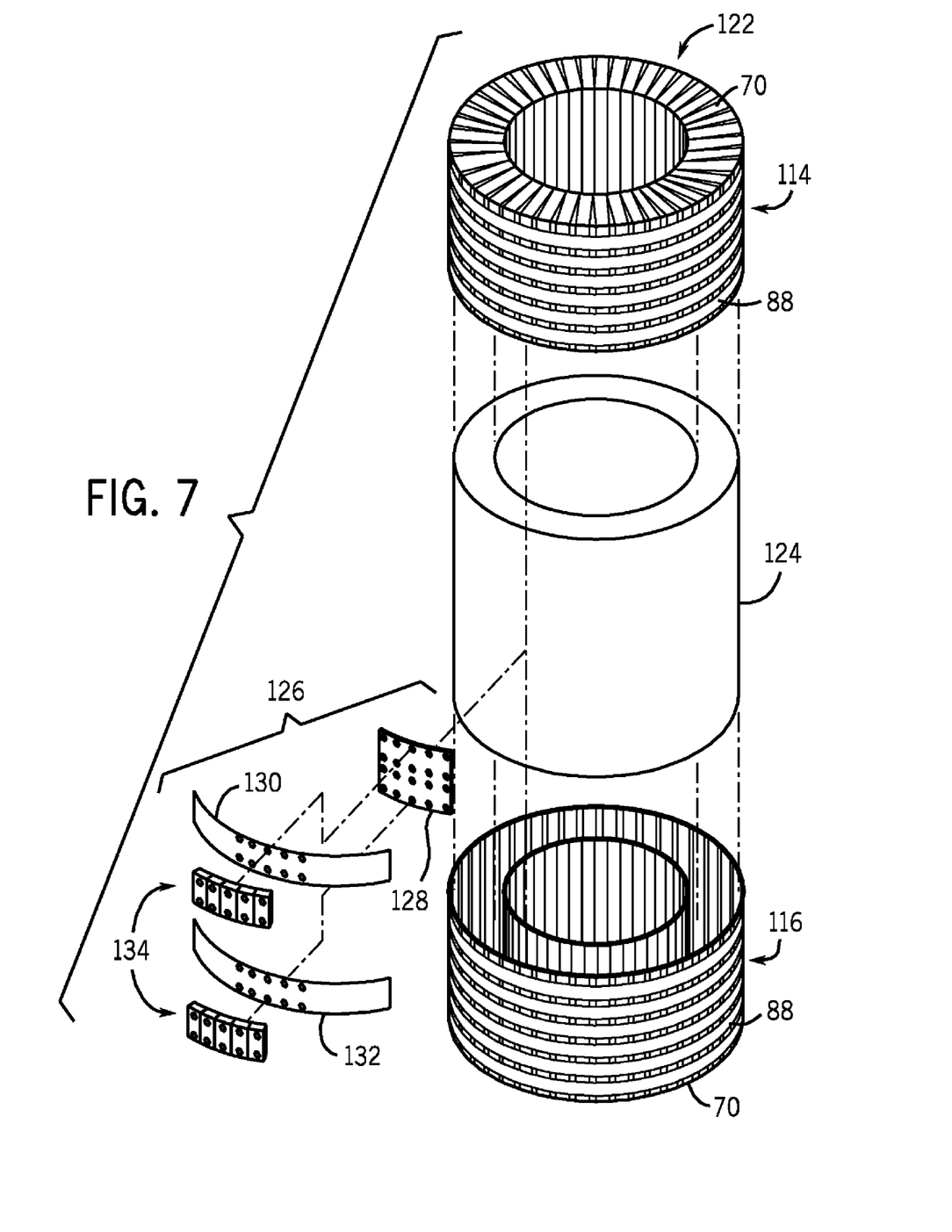
FIG. 7 is an exploded view of a thermal shield in accordance with an embodiment of the present invention.

FIG. 7 shows an exploded view of a thermal shield 122 in accordance with an embodiment of the present invention. Shell sections 114, 116 are placed about a cold mass 124 so as to enclose the cold mass 124. Shell sections 114, 116 are joined together and connected to a thermal link or central structure 126 including an inner plate 128, a pair of outer metal plates 130, 132 and a plurality of metal blocks 134. Outer metal plates 130, 132 are preferably formed of aluminum or copper, and blocks 134 are preferably formed of copper; however, one skilled in the art will appreciate that other materials may be used. Outer metal plates 130, 132 are bonded to shell sections 114, 116 to enhance thermal contact between blocks 134 and shell sections 114, 116.

Figure 8:
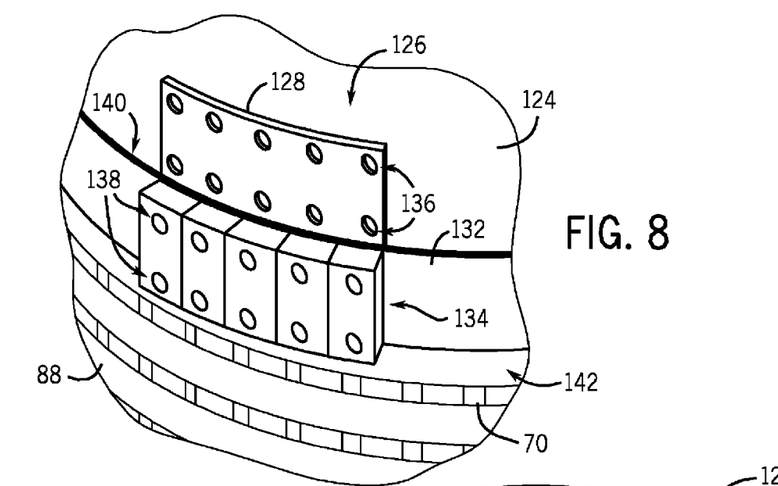
FIG. 8 is a perspective view of a partial assembly of the thermal shield of FIG. 7.

FIG. 8 shows inner metal plate 128, an outer metal plate 130, and a plurality of metal blocks 134 assembled to a shell section 116. Inner metal plate 128 has a plurality of holes 136 formed therein to align with holes 138 formed in each metal block 134. Inner plate 128 is positioned adjacent to an inner surface 140 of shell section 116. An outer surface 142 of shell section 116 has outer metal plate 132 positioned adjacent thereto. A plurality of metal blocks 134 are positioned adjacent to the outer metal plate 132 and secured to the inner plate 128. Preferably, the plurality of metal blocks 134 are bolted to the inner plate 128.

Figure 9:
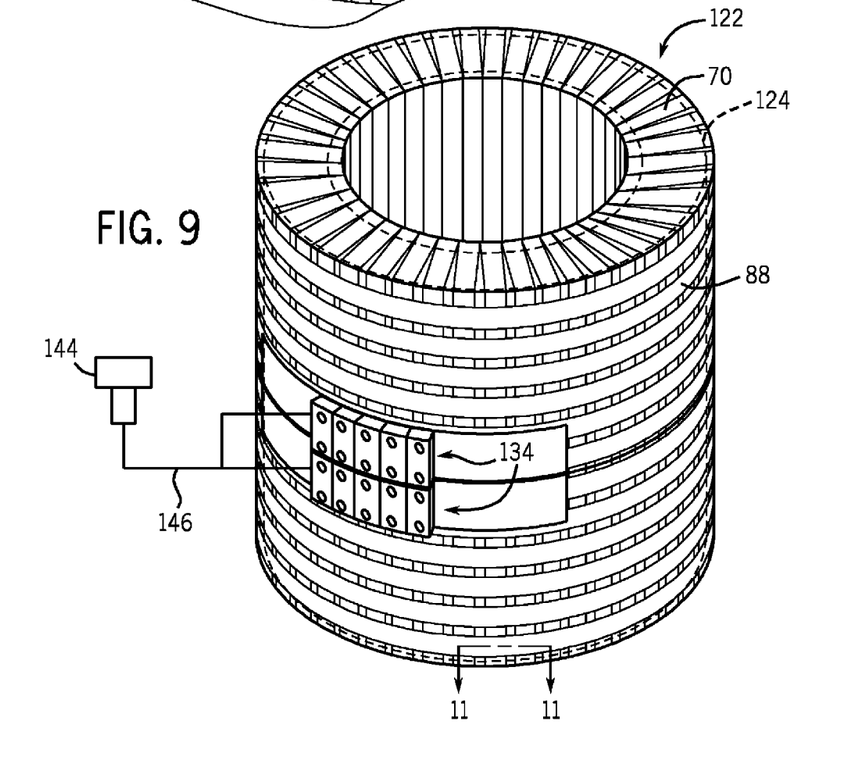
FIG. 9 is a perspective view of the thermal shield of FIG. 7 in assembled form.

FIG. 9 shows an assembled thermal shield 122. A cryogenic cold head 144 is shown schematically attached to the plurality of metal blocks 134. A plurality of copper braids 146 are thermally connected to the cryogenic cold head 144 and to the plurality of metal blocks 134. Heat generated in thermal shield 122 is conducted toward the plurality of metal blocks 134 via cables 70, 88. The heat is further conducted toward the cold head via the plurality of copper braids 146.

Figure 10:
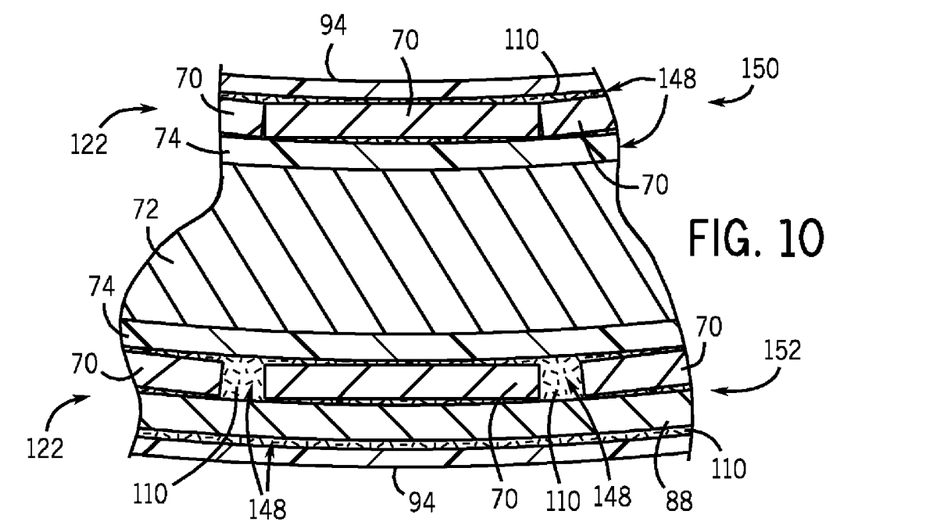
FIG. 10 is a cross sectional view taken along line 10-10 of FIG. 5.
Figure 11:
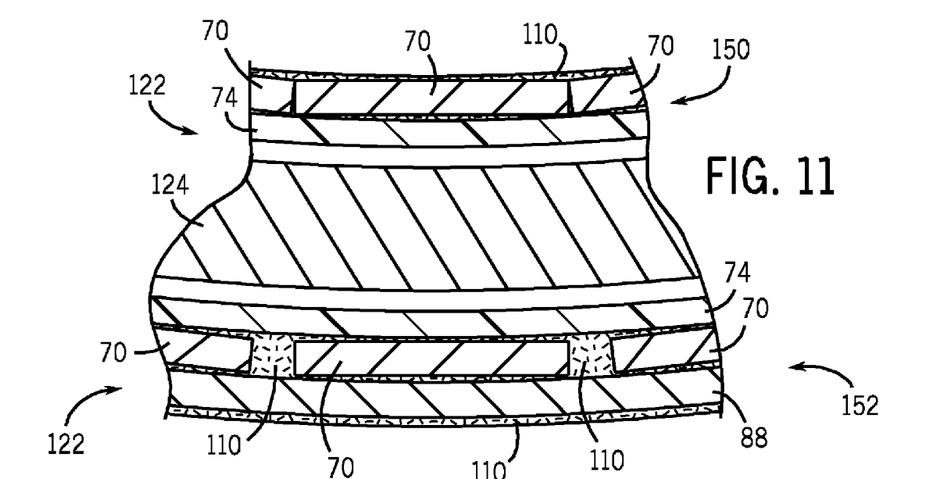
FIG. 11 is a cross sectional view taken along line 11-11 of FIG. 9.

FIG. 10 shows a cross sectional view taken along line 10-10 of FIG. 5. Matrix 110 infused in vacuum bag 94 fills voids 148 between fiberglass cloth 74, cables 70, 88 and vacuum bag 94. FIG. 11 shows a cross sectional view taken along line 11-11 of FIG. 9. Thermal shield 122 surrounds cold mass 124 to intercept radiation and conduction heat loads thereto. As shown in FIGS. 10 and 11, an inside wall 150 of thermal shield 122 has a layer of axially wrapped cables 70 while an outside wall 152 of thermal shield 122 has a layer of axially wrapped cables 70 and a layer of spirally wrapped cables 88.

Figure 12:
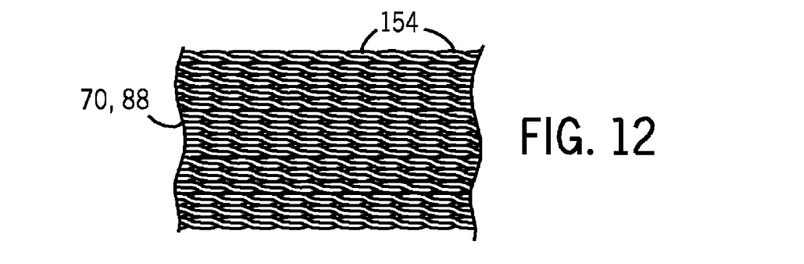
FIG. 12 is a preferred arrangement for thermally conductive cables in accordance with an embodiment of the present invention.

FIG. 12 shows a preferred arrangement for cables 70, 88. Cables 70, 88 are preferably constructed of a plurality of fibers or strands 154 braided together in a Litz wire configuration. Strands 154 are preferably constructed of aluminum or copper and are electrically insulated from one another. In this manner, each strand 154 acts individually in generating eddy currents and AC losses. Cables 70, 88 constructed of the Litz wire configuration shown in FIG. 12 have reduced eddy currents and AC losses in an AC field than in a single strand cable of equal diameter.

Figure 13:
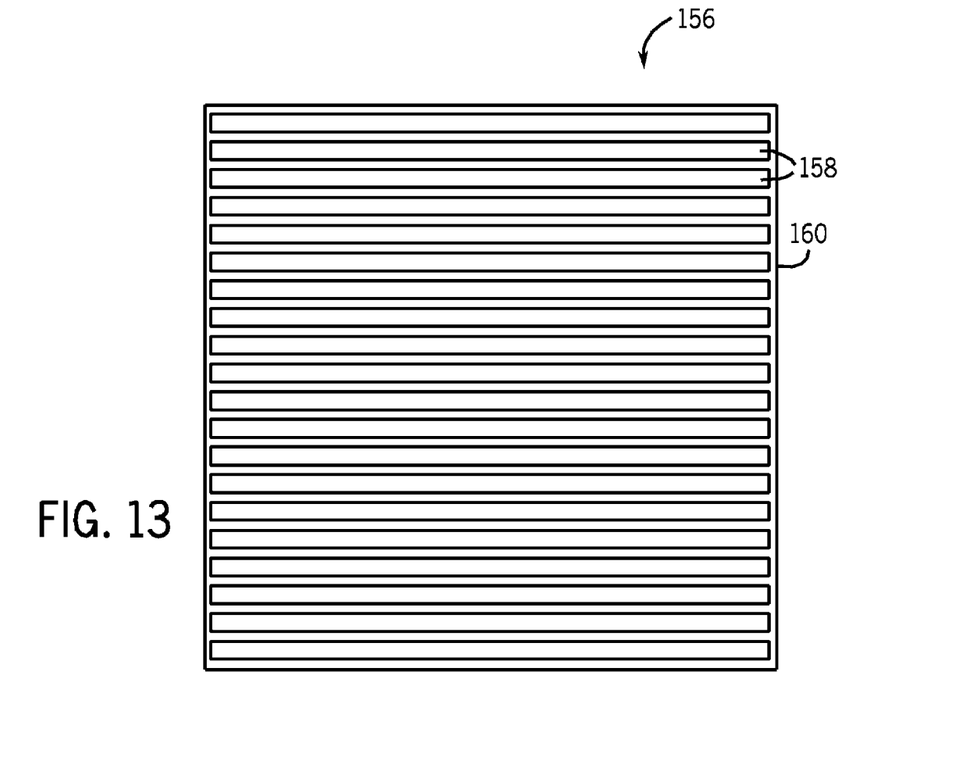
FIGS. 13-15 show steps of making a thermal shield in accordance with an embodiment of the present invention.
Figure 14:
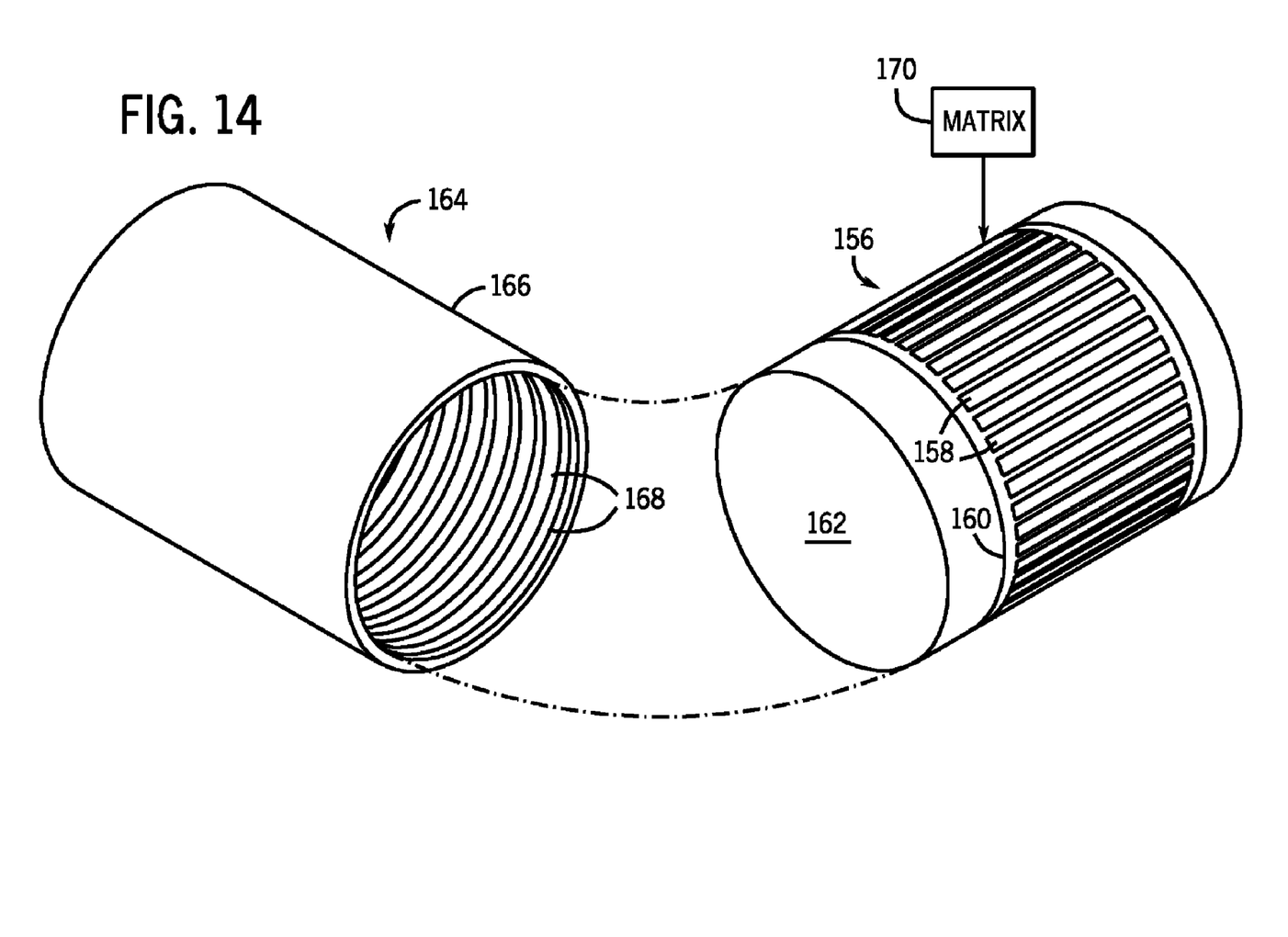
Figure 15:
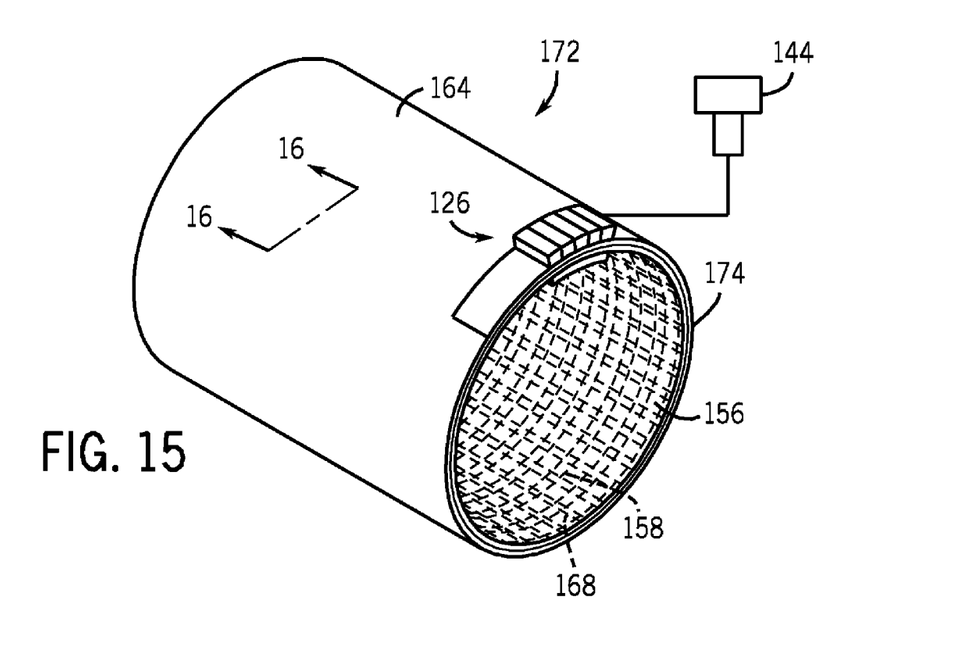

FIGS. 13-15 show steps of making a thermal shield in accordance with an embodiment of the present invention. FIG. 13 shows a shell 156 of a thermal shield in accordance with an embodiment of the present invention. A plurality of cables 158 are laid onto a flat, flexible sheet 160 with adhesives. Sheet 160 is preferably a thin (G10) fiberglass sheet.

As shown in FIG. 14, shell 156 is placed on a tooling form 162 defining a desired shape. In a preferred embodiment, another shell 164 having a sheet 166 and a plurality of cables 168 is positioned adjacent to shell 156. The plurality of cables 168 of shell 164 are preferably oriented 90 degrees with respect to the plurality of cables 158 of shell 156. A matrix 170 is then infused and cured about shells 156, 164 to bond them together. A vacuum bag (not shown) may be used as described above in FIGS. 4 and 5 for matrix 170 infusion and curing.

FIG. 15 shows a thermal shield 172 positionable around a cold mass (not shown) in accordance with an embodiment of the present invention. A central structure 126, as described above, is attached to an end 174 of bonded shells 156, 164 and is thermally connected to a cryogenic cold head 176.

Figure 16:
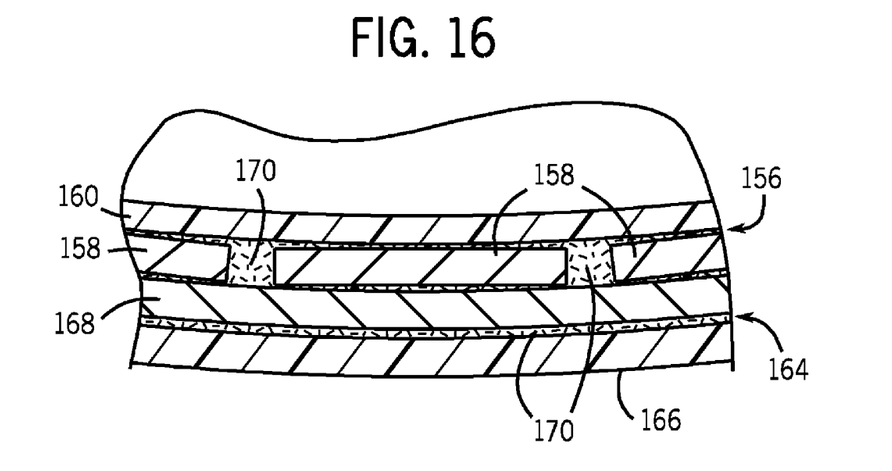
FIG. 16 is a cross sectional view taken along line 16-16 of FIG. 15.

FIG. 16 shows a cross sectional view taken along line 16-16 of FIG. 15. Shells 156, 164 encircle axially wrapped cables 158, circumferentially wrapped cables 168, and matrix 170.

Figure 17:
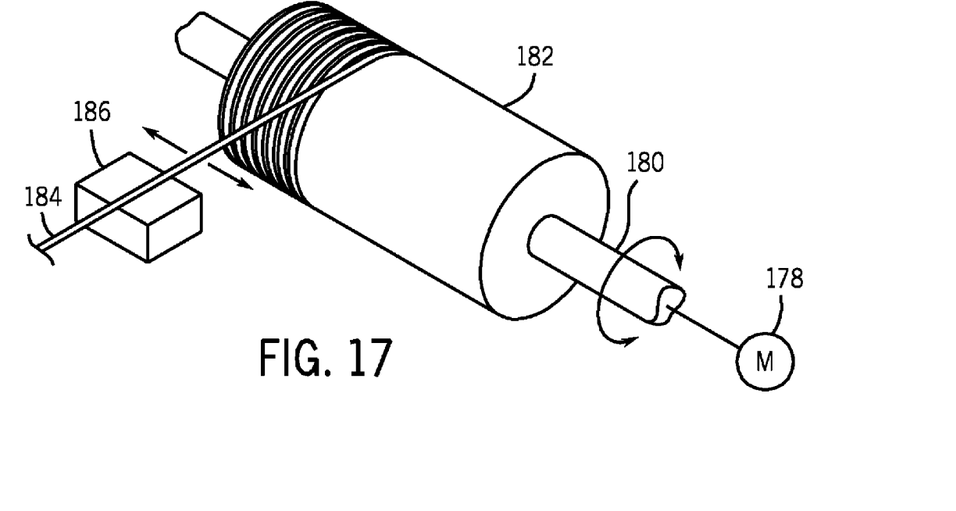
FIG. 17 shows a step of making a shell of thermal shield in accordance with an embodiment of the present invention.

FIG. 17 shows an aspect of making a thermal shield in accordance with an embodiment of the present invention. A motor 178 attached to a shaft 180 rotates a drum 182 having a cable 184 spirally wrapped therearound. Cable 184 passes through an matrix bath 186 and is wet wound onto rotating drum 182 while being simultaneously translated axially along drum 182. The matrix bath 186 preferably includes epoxy. Following wet winding of the matrix coated cable 184 onto drum 182, the matrix coated cable 184 is allowed to cure to form a shell (not shown) and is removed from drum 182. A central structure (not shown), as described above, is attached to the shell, and the shell is positioned about a cold mass (not shown).

A thermal shield according to an embodiment of the present invention reduces heat generated by eddy currents and reduces AC losses. Furthermore, during a magnet quench, as the current of the magnet coil rapidly decays to zero, eddy currents and quench forces induced in the thermal shield will be minimized, thus allowing the thermal shield to withstand the quench forces.

Therefore, an apparatus is disclosed and includes a cryogenic cold head and a plurality of thermally conducting fibers positioned along a desired direction of heat conduction, each fiber electrically insulated from another fiber. A matrix bonding the plurality of thermally conducting fibers together is included. The apparatus also includes at least one thermal link connecting the plurality of thermally conducting fibers to the cryogenic cold head.

The present invention is also embodied in a method of manufacturing a thermal shield that includes positioning at least one thermally conducting fiber on a tooling form along a desired path of heat conduction, the at least one thermally conducting fiber coated with electrical insulation. The method further includes fixing the at least one thermally conducting fiber with a matrix and thermally connecting the at least one thermally conducting fiber to a cryogenic cold head.

An MRI apparatus is also presented and includes a magnetic resonance imaging system having a plurality of gradient coils positioned about a bore of a superconducting magnet to impress a polarizing magnetic field and an RF transceiver system and an RF switch controlled by a pulse module to transmit RF signals to an RF coil assembly to acquire MR images. The MRI apparatus also includes a cryogenic cold head and a thermal link thermally connected to the cryogenic cold head. The apparatus further includes a thermal shield positioned adjacent to the superconducting magnet, the thermal shield comprising a set of electrically insulated wires thermally attached to the thermal link and configured to conduct heat to the thermal shield. A matrix is included affixing the set of electrically insulated wires together.

The present invention has been described in terms of the preferred embodiment, and it is recognized that equivalents, alternatives, and modifications, aside from those expressly stated, are possible and within the scope of the appending claims.

What is claimed is:

1. An MRI apparatus comprising:
a cryogenic cold head and a thermal shield, the thermal shield comprising;
a plurality of thermally conducting cables positioned along a desired path of heat conduction, and electrically insulated from one another;
an infused epoxy matrix cured around the plurality of thermally conducting cables thereby bonding them together, wherein the cables are constructed of a plurality of fibers braided together in a Litz wire configuration; and
at least one thermal link connecting the plurality of thermally conducting cables to the cryogenic cold head.

2. The MRI apparatus of claim 1 wherein the plurality of fibers comprise copper.

3. The MRI apparatus of claim 1 wherein the plurality of fibers comprise aluminum.

4. The MRI apparatus of claim 1 wherein the bonded plurality of thermally conducting cables form a shell.

5. The MRI apparatus of claim 4 wherein the shell is further configured to surround the superconducting magnet I.

6. The MRI apparatus of claim 1 further comprising a flexible sheet, wherein the matrix bonds the flexible sheet to the plurality of thermally conducting cables.

7. The MRI apparatus of claim 6 wherein the flexible sheet comprises fiberglass.

8. An MRI apparatus comprising:
- a magnetic resonance imaging (MRI) system having a plurality of gradient coils positioned about a bore of a superconducting magnet configured to impress a polarizing magnetic field and an RF transceiver system and an RF switch controlled by a pulse module configured to transmit RF signals to an RF coil assembly also configured to acquire MR images;
- a cryogenic cold head;
- a thermal link thermally connected to the cryogenic cold head;
- a thermal shield positioned adjacent to the superconducting magnet, the thermal shield comprising
  - a set of electrically insulated wires thermally attached to the thermal link and configured to conduct heat to the thermal shield; and
  - an infused epoxy matrix cured around and affixing the set of electrically insulated wires together, wherein the wires are constructed of a plurality of fibers braided together.

9. The MRI apparatus of claim 8 further comprising a fiberglass sheet affixed to the set of electrically insulated wires.

10. The MRI apparatus of claim 8 wherein the set of electrically insulated wires comprise one of copper and aluminum.

11. The MRI apparatus of claim 8 wherein the wires of the set of electrically insulated wires are woven into a braided Litz wire cable.

* * * * *